United States Patent
Lee et al.

(10) Patent No.: US 9,954,040 B2
(45) Date of Patent: *Apr. 24, 2018

(54) ORGANIC LIGHT-EMITTING DISPLAY APPARATUS

(71) Applicant: SAMSUNG DISPLAY CO., LTD., Yongin-si, Gyeonggi-do (KR)

(72) Inventors: Duckjung Lee, Yongin-si (KR); Taewook Kang, Yongin-si (KR); Jaesik Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,665

(22) Filed: Apr. 18, 2017

(65) Prior Publication Data

US 2017/0221973 A1    Aug. 3, 2017

Related U.S. Application Data

(63) Continuation of application No. 14/797,295, filed on Jul. 13, 2015, now Pat. No. 9,653,698.

(30) Foreign Application Priority Data

Oct. 22, 2014 (KR) .................. 10-2014-0143593

(51) Int. Cl.
*H01L 27/32* (2006.01)
*H01L 51/50* (2006.01)
(Continued)

(52) U.S. Cl.
CPC ...... *H01L 27/3246* (2013.01); *H01L 27/3211* (2013.01); *H01L 51/001* (2013.01);
(Continued)

(58) Field of Classification Search
CPC ............. H01L 27/3246; H01L 51/524; H01L 51/5253; H01L 51/5228; H01L 27/3211;
(Continued)

(56) References Cited

U.S. PATENT DOCUMENTS 9,653,698 B2 * 5/2017 Lee .................. H01L 51/001
2010/0289728 A1   11/2010 Nakatani et al.
(Continued)

FOREIGN PATENT DOCUMENTS

JP     2005-251497 A     9/2005
KR    10-2009-0028513 A    3/2009
(Continued)

*Primary Examiner* — Kyoung Lee
(74) *Attorney, Agent, or Firm* — Lee & Morse, P.C.

(57) ABSTRACT

Provided are an organic light-emitting display apparatus and a method of manufacturing the same. The organic light-emitting display apparatus includes a display substrate; a thin film transistor (TFT) on the display substrate; an organic light-emitting diode (OLED) electrically connected to the TFT and including a first electrode on sub-pixels of the display substrate, an intermediate layer on the first electrode, and a second electrode on the intermediate layer; a pixel-defining layer which includes an opening exposing at least a portion of the first electrode and defines each sub-pixel; and a sealing substrate covering the OLED, the intermediate layer including a plurality of stacked layers, and a cross-sectional width of the intermediate layer gradually decreasing in a direction perpendicular to the display substrate.

15 Claims, 7 Drawing Sheets

(51) Int. Cl.
*H01L 51/56* (2006.01)
*H01L 51/52* (2006.01)
*H01L 51/00* (2006.01)

(52) U.S. Cl.
CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/524* (2013.01); *H01L 51/5228* (2013.01); *H01L 51/5253* (2013.01); *H01L 51/56* (2013.01); *H01L 51/5268* (2013.01); *H01L 2227/323* (2013.01); *H01L 2251/55* (2013.01)

(58) Field of Classification Search
CPC ........... H01L 2227/323; H01L 51/5088; H01L 51/5072; H01L 51/5056; H01L 51/5268; H01L 51/5092; H01L 51/56
See application file for complete search history.

(56) References Cited

U.S. PATENT DOCUMENTS

| | | |
|---|---|---|
| 2011/0084291 A1 | 4/2011 | Jeong et al. |
| 2012/0181554 A1 | 7/2012 | Irving et al. |
| 2013/0236999 A1 | 9/2013 | Lee et al. |

FOREIGN PATENT DOCUMENTS

| | | |
|---|---|---|
| KR | 10-2010-0051106 A | 5/2010 |
| KR | 10-2012-0076940 A | 7/2012 |
| WO | WO 2011/139771 A2 | 11/2011 |

\* cited by examiner

ORGANIC LIGHT-EMITTING DISPLAY APPARATUS

CROSS-REFERENCE TO RELATED APPLICATIONS

This is a continuation application based on pending application Ser. No. 14/797,295, filed Jul. 13, 2015, the entire contents of which is hereby incorporated by reference.

Korean Patent Application No. 10-2014-0143593, filed on Oct. 22, 2014, in the Korean Intellectual Property Office, and entitled: "Organic Light-Emitting Display Apparatus and Fabrication Method Thereof," is incorporated by reference herein in its entirety.

BACKGROUND

1. Field

One or more exemplary embodiments relate to an organic light-emitting display apparatus and a method of manufacturing the same.

2. Description of the Related Art

An organic light-emitting display apparatus may be used for a mobile device such as a smart phone, a tablet personal computer (PC), a laptop, a digital camera, a camcorder, or a personal digital assistant (PDA), or an electronic device such as an ultra-thin television or electronic billboard.

SUMMARY

Embodiments may be realized by providing an organic light-emitting display apparatus, including a display substrate; a thin film transistor (TFT) on the display substrate; an organic light-emitting diode (OLED) electrically connected to the TFT and including a first electrode on sub-pixels of the display substrate, an intermediate layer on the first electrode, and a second electrode on the intermediate layer; a pixel-defining layer which includes an opening exposing at least a portion of the first electrode and defines each sub-pixel; and a sealing substrate covering the OLED, the intermediate layer including a plurality of stacked layers, and a cross-sectional width of the intermediate layer gradually decreasing in a direction perpendicular to the display substrate.

The perpendicular direction may be a direction between the sealing substrate and the display substrate, and the cross-sectional width of the intermediate layer may gradually decrease from the display substrate toward the sealing substrate.

The intermediate layer may be positive-taper shaped.

An angle of a taper of the intermediate layer may be an acute angle.

The intermediate layer may include an emissive layer; and at least one pattern layer stacked on at least one surface of the emissive layer.

The at least one pattern layer may include one or more of a hole injection layer (HIL), a hole transport layer (HTL), an electron transport layer (ETL), or an electron injection layer (EIL).

A first pattern layer including the HIL and the HTL may be between the first electrode and the emissive layer, a second pattern layer including the ETL and the EIL may be between the emissive layer and the second electrode, and a cross-sectional width of the first pattern layer may be larger than a cross-sectional width of the second pattern layer.

The intermediate layer may only be in an emission area of each sub-pixel defined by the pixel-defining layer.

The second electrode may be in a portion of the emission area of each sub-pixel, the portion corresponding to the intermediate layer, and n auxiliary electrode may be electrically connected to the second electrode and may be on the emission area of each sub-pixel and the pixel-defining layer in order to apply a common voltage to each sub-pixel.

The second electrode may be on the emission area of each sub-pixel and the pixel-defining layer.

An area of a cross-section of at least one layer of the stacked layers may be smaller than an area of a cross-section at least another layer of the stacked layers, the at least one layer being above the at least another layer in a direction from the display substrate to the sealing substrate.

Embodiments may be realized by providing method of manufacturing an organic light-emitting display apparatus, the method including forming a pixel-defining layer, which includes an opening exposing at least a portion of a first electrode of an organic light-emitting diode (OLED) and defining sub-pixels, on a display substrate; patterning a photo-pattern layer on the display substrate; forming an intermediate layer of the OLED on the first electrode through the opening; forming a second electrode of the OLED on the intermediate layer; and removing the photo-pattern layer from the display substrate, forming the intermediate layer including stacking a plurality of layers, the plurality of layers having cross-sectional widths gradually decreasing in size in a direction perpendicular to the display substrate.

The method may further include forming a resin covering the pixel-defining layer, and forming a photoresist on the resin. Patterning the photo-pattern layer may include light-exposing, developing, and etching the resin and the photoresist so as to expose the opening.

The plurality of layers of the intermediate layer may be formed after deposition materials are emitted from a deposition source toward the opening and the deposition materials are deposited on the display substrate, a portion of which is exposed to the outside by the opening, and a plurality of deposition layers formed of the same deposition materials as in the plurality of layers may be formed on the photo-pattern layer, which is formed on the pixel-defining layer while the intermediate layer is formed.

The method may further include forming a sealing substrate which covers the OLED. The plurality of deposition layers on the photo-pattern layer may gradually cover the opening during continuous deposition, and a cross-sectional width of the intermediate layer on the display substrate may gradually decrease in size from the display substrate to the sealing substrate.

The intermediate layer may be positive-taper shaped.

An angle of a taper of the intermediate layer may be an acute angle, and the intermediate layer may include at least one pattern layer stacked on at least one surface of an emissive layer, and the emissive layer and the at least one pattern layer may be sequentially deposited in a direction perpendicular to the display substrate.

The at least one pattern layer may include one or more of a hole injection layer (HIL), a hole transport layer (HTL), an electron transport layer (ETL), or an electron injection layer (EIL).

The second electrode may be formed on the intermediate layer in an emission area of each sub-pixel, and after the photo-pattern layer is removed, an auxiliary electrode electrically connected to the second electrode may be forming on the emission area of each sub-pixel and the pixel-defining layer.

The intermediate layer may only be formed on an emission area of each sub-pixel defined by the pixel-defining layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
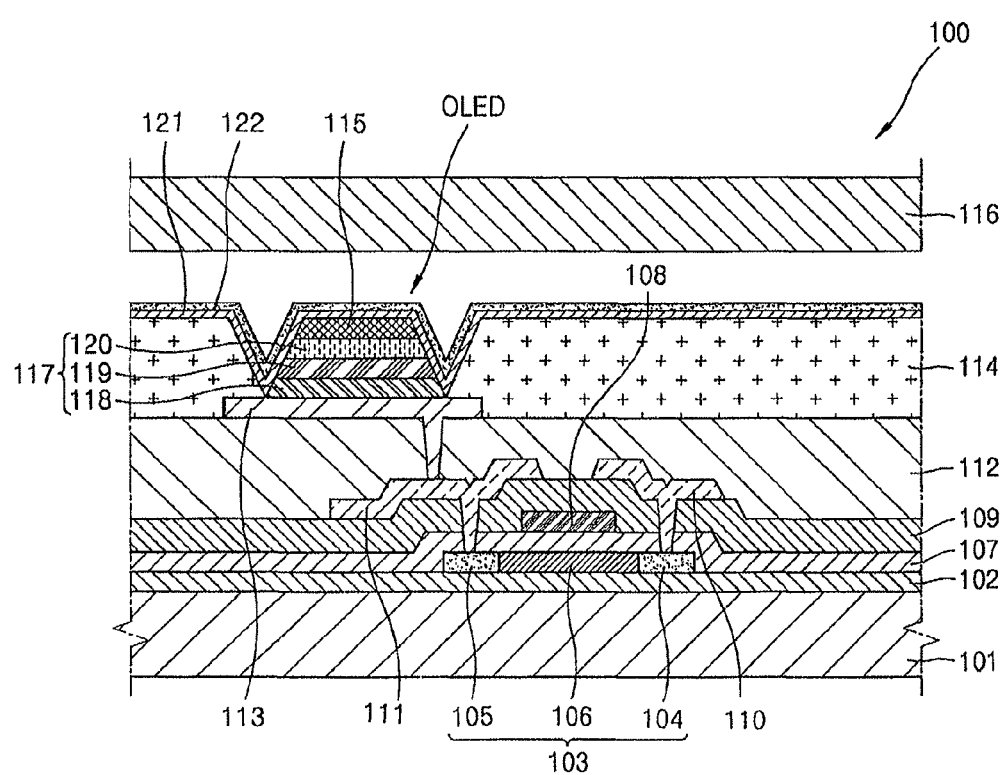
FIG. 1 illustrates a cross-sectional view of a sub-pixel of an organic light-emitting display apparatus, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

While such terms as "first", "second", etc., may be used to describe various components, such components must not be limited to the above terms. The above terms are used only to distinguish one component from another.

The terms used in the present specification are merely used to describe particular embodiments, and are not intended to be limiting. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

One or more embodiments of an organic light-emitting display apparatus and a method of manufacturing the same will be described with reference to the accompanying drawings. Like reference numerals in the drawings denote like elements, and their description will be omitted.

FIG. 1 illustrates a cross-sectional view of a sub-pixel of an organic light-emitting display apparatus 100, according to an exemplary embodiment. Referring to FIG. 1, the organic light-emitting display apparatus 100 may include a display substrate 101 and a sealing substrate 116 facing the display substrate 101.

The display substrate 101 may be formed of insulating materials having flexibility or rigidity. For example, the display substrate 101 may be a flexible film, a glass substrate having rigidity, a metal substrate, or a combination thereof. The display substrate 101 may be transparent, translucent, or opaque.

A barrier layer 102 may be formed on the display substrate 101. The barrier layer 102 may cover an entire upper surface of the display substrate 101.

The barrier layer 102 may include an inorganic layer or an organic layer. For example, the barrier layer 102 may be formed of one or more of inorganic materials such as silicon oxide ($SiO_x$), silicon nitride ($SiN_x$), silicon oxynitride (SiON), aluminum oxide (AlO), and aluminum oxynitride (AlON), or organic materials such as acryl, polyimide, and polyester.

The barrier layer 102 may be a single layer or multiple layers. The barrier layer 102 may prevent penetration of oxygen and moisture and may flatten the upper surface of the display substrate 101.

A thin film transistor (TFT) may be formed on the barrier layer 102. In the present exemplary embodiment, the TFT is a top gate transistor, but may be another type of transistor, for example, a bottom gate transistor.

A semiconductor active layer 103 may be formed on the barrier layer 102. The semiconductor active layer 103 may include a source area 104 and a drain area 105 doped with N-type impurity ions or P-type impurity ions. A channel area 106 which is not doped with impurities may be disposed between the source area 104 and the drain area 105.

The semiconductor active layer 103 may be an inorganic semiconductor formed of amorphous silicon, or poly silicon or an organic semiconductor.

The semiconductor active layer 103 may be an oxide semiconductor. For example, the oxide semiconductor may include oxides of Group 4, 12, 13 and 14 elements such as zinc (Zn), indium (In), gallium (Ga), tin (Sn), cadmium (Cd), germanium (Ge), and hafnium (Hf), and combinations thereof.

A gate insulating layer 107 may be deposited on the semiconductor active layer 103. The gate insulating layer 107 may be an inorganic layer formed of $SiO_x$, $SiN_x$, or a metal oxide. The gate insulating layer 107 may be a single layer or multiple layers.

A gate electrode 108 may be formed on the gate insulating layer 107. The gate electrode 108 may have a single layer or multiple layers formed of, for example, Au, Ag, Cu, Ni, Pt, Pd, Al, Mo, or Cr. The gate electrode 108 may include an alloy such as Al:Nd or Mo:W.

An interlayer insulating layer 109 may be formed on the gate electrode 108. The interlayer insulating layer 109 may be an inorganic layer formed of, for example, SiOx or SiNx. The interlayer insulating layer 109 may be an organic layer.

A source electrode 110 and a drain electrode 111 may be formed on the interlayer insulating layer 109. For example, contact holes may be formed in the gate insulating layer 107 and the interlayer insulating layer 109 by selectively removing portions of the gate insulating layer 107 and the interlayer insulating layer 109. Through the contact holes, the source electrode 110 may be electrically connected to the source area 104, and the drain electrode 111 may be electrically connected to the drain area 105.

A protective layer 112 (a passivation layer and/or planarization layer) may be formed on the source electrode 110 and the drain electrode 111. The protective layer 112 may cover the source electrode 110 and the drain electrode 111. The protective layer 112 may include an inorganic material such as $SiO_x$ or $SiN_x$, or an organic material such as acryl, polyimide, or benzocyclobutene (BCB).

An organic light-emitting diode (OLED) may be formed on the TFT.

The OLED may be formed on the protective layer 112. The OLED may include a first electrode 113, an intermediate layer 117, and a second electrode 115.

The first electrode 113 may be electrically connected to the source electrode 110 or the drain electrode 111 through the contact holes formed by removing portions of the protective layer 112.

The first electrode 113 may function as an anode and may be formed of various conductive materials. The first electrode 113 may include a transparent electrode or a reflective electrode. For example, when the first electrode 113 is used as a transparent electrode, the first electrode 113 may include a transparent conductive layer formed of, for example, indium tin oxide (ITO), indium zinc oxide (IZO), zinc oxide (ZnO), or indium oxide ($In_2O_3$). When the first electrode 113 is used as a reflective electrode, the first electrode 113 may form a reflective layer by using Ag, Mg, Al, Pt, Pd, Au, Ni, Nd, Ir, Cr, or a combination thereof, and a transparent conductive layer formed of, for example, ITO, IZO, ZnO, or $In_2O_3$, may be formed on an upper surface of the reflective layer.

A pixel-defining layer 114 may be formed on the protective layer 112 and may cover a portion of the first electrode 113. The pixel-defining layer 114 may define an emission area of each sub-pixel by surrounding edges of the first electrode 113. The first electrode 113 may be patterned on each sub-pixel.

The pixel-defining layer 114 may be an organic or inorganic layer. For example, the pixel-defining layer 114 may be formed of organic materials such as, for example, polyimide, polyamide, BCB, acrylic resin, or phenol resin, or inorganic materials such as $SiN_x$.

The pixel-defining layer 114 may be a single layer or multiple layers.

The intermediate layer 117 may be formed on an area of the first electrode 113 which is exposed by etching a portion of the pixel-defining layer 114. The intermediate layer 117 may be formed by deposition.

The intermediate layer 117 may have a multilayer structure.

For example, the intermediate layer 117 may include an emissive layer 119 and at least one pattern layer 118 and 120 formed on at least one surface of the emissive layer 119. The at least one pattern layer 118 and 120 may be formed in a direction perpendicular to the display substrate 101.

The intermediate layer 117 may include the emissive layer 119 and may further include one or more of a hole injection layer (HIL), a hole transport layer (HTL), an electron transport layer (ETL), or an electron injection layer (EIL). In an embodiment, the intermediate layer 117 may include the emissive layer 119 and may further include various functional layers such as a scattering layer.

In the present exemplary embodiment, a first pattern layer 118 may be formed between the first electrode 113 and the emissive layer 119. The first pattern layer 118 may include an HIL and an HTL. A second pattern layer 120 may be formed between the emissive layer 119 and the second electrode 115. The second pattern layer 120 may include an ETL and an EIL.

Holes and electrons injected from the first electrode 113 and the second electrode 115 may be combined in the emissive layer 119 and may emit light of desired colors.

The second electrode 115 may be formed on the intermediate layer 117.

The second electrode 115 may function as a cathode. The second electrode 115 may include a transparent electrode or a reflective electrode. For example, when the second electrode 115 is used as a transparent electrode, metals having a low work function, for example, lithium (Li), calcium (Ca), lithium fluoride (LiF)/Ca, LiF/Al, Al, magnesium (Mg), or a combination thereof may be deposited on the intermediate layer 117, and the transparent conductive layer formed of ITO, IZO, ZnO, $In_2O_3$, etc. may be formed on the above metals or combination. When the second electrode 115 is used as a reflective electrode, the second electrode 115 may be formed of Li, Ca, LiF/Ca, LiF/Al, Al, Mg, and/or a combination thereof.

In the present exemplary embodiment, the first electrode 113 may function as an anode, and the second electrode 115 may function as a cathode. In an embodiment, the first electrode 113 may function as a cathode, and the second electrode 115 may function as an anode.

In an embodiment, multiple sub-pixels may be formed on the display substrate 101, and each of the sub-pixels may emit red light, green light, blue light, or white light.

The intermediate layer 117 may be formed to substantially cover the first electrode 113 regardless of locations of the sub-pixels. In an emissive layer, layers including emissive materials which respectively emit red light, green light, and blue light may be vertically stacked, or the emissive layer may be formed of mixtures of the emissive materials which respectively emit red light, green light, and blue light.

If an emissive material emits white light, it may be possible to mix other colors. The emissive layer may further include a color-converting layer or a color filter which converts the emitted white color into light of another color.

The sealing substrate 116 may be formed on the OLED. The sealing substrate 116 may be formed to protect the intermediate layer 117 and other thin films from, for example, moisture or oxygen, penetrating from the outside.

The sealing substrate 116 may be glass having rigidity or a film having polymer resin or flexibility. The sealing substrate 116 may have a structure in which organic layers and inorganic layers are alternately stacked on the OLED.

In the present exemplary embodiment, the intermediate layer 117 may have a stack structure in which multiple layers are stacked. Areas of respective cross-sections of the stacked layers may gradually decrease in the direction perpendicular to the display substrate 101.

The intermediate layer 117 may include the first pattern layer 118 including the HIL and HTL, the emissive layer 119, and the second pattern layer 120 including the ETL and the EIL.

The layers included in the intermediate layer 117 may continue to be stacked in an upward direction from an upper surface of the display substrate 101. A cross-section of the intermediate layer 117 may gradually decrease in size, e.g., in width in a direction perpendicular to the upward direction from the upper surface of the display substrate, from the display substrate 101 to the sealing substrate 116. For example, a cross-sectional width of a bottom layer of the intermediate layer 117, that is, a cross-sectional width of the first pattern layer 118, may be larger than a cross-sectional width of a top layer of the intermediate layer 117, that is, a cross-sectional width of the second pattern layer 120. The cross-sectional width of the bottom layer of the intermediate layer 117, that is, the cross-sectional width of the first pattern layer 118, may be larger than a cross-sectional width of the emissive layer 119. The cross-sectional width of the emissive layer 119 may be larger than the cross-sectional width of the top layer of the intermediate layer 117, that is, the cross-sectional width of the second pattern layer 120. In an embodiment, a cross-sectional width of the first pattern layer 118 may be the largest, and that of the second pattern layer may be the smallest 120.

FIG. 1 illustrates an area of a cross-section of the intermediate layer taken in a transverse plane that extends in a perpendicular direction relative to the display substrate decreasing in a direction perpendicular to the display substrate.

The intermediate layer 117 may be positive-taper shaped, and an angle of the intermediate layer 117 may be acute. For example, an angle between the bottom layer of the intermediate layer 117 which contacts the first electrode 113 and a side surface of the intermediate layer 117 may be smaller than 90 degrees.

The intermediate layer 117 may be deposited through a deposition process. The intermediate layer 117 may be formed only in an emission area of each sub-pixel defined by the pixel-defining layer 114.

In the present exemplary embodiment, emissive materials having different colors may be respectively deposited in the sub-pixels, and the sub-pixels may respectively emit red light, green light, and blue light. In another exemplary embodiment, emissive materials having red, green, and blue colors may be vertically stacked, and the emissive materials having red, green, and blue colors may be mixed in one sub-pixel.

The first pattern layer 118 including the HIL and the HTL may be commonly formed. In the present exemplary embodiment, each of the HIL and the HTL may be formed in the emission area of each sub-pixel. The first pattern layer 118 may not be formed on an outer surface of the pixel-defining layer 114.

The second pattern layer 120 including the ETL and the EIL may also be commonly formed. As in the case of the first pattern layer 118, the second pattern layer 120 may be formed in the emission area of each sub-pixel.

The second electrode 115 may be formed on an upper surface of the second pattern layer 120. The second electrode 115 may be formed on each sub-pixel. The second electrode 115 may be an electrode which applies a common voltage to each sub-pixel.

An auxiliary electrode 121 may be further formed to apply the common voltage to each sub-pixel. The auxiliary electrode 121 may be electrically connected to the second electrode 115. The auxiliary electrode 121 may be formed on the emission area of each pixel and the pixel-defining layer 114. In the present exemplary embodiment, the auxiliary electrode 121 may be formed on an outer surface of the pixel-defining layer 114, an outer surface of the second electrode 115, and side surfaces of the intermediate layer 117.

In the present exemplary embodiment, the second electrode 115 used as a common electrode and the auxiliary electrode 121 may be respectively formed. If the second electrode 115 applies the common voltage to every sub-pixel, a structure of the second electrode 115 may not be a single structure. For example, without the auxiliary electrode 121, the second electrode 115 may be formed on the emission area of each sub-pixel and the pixel-defining layer 114.

A capping layer 122 for protecting the OLED may be further formed on the auxiliary electrode 121.

Figure 2A:
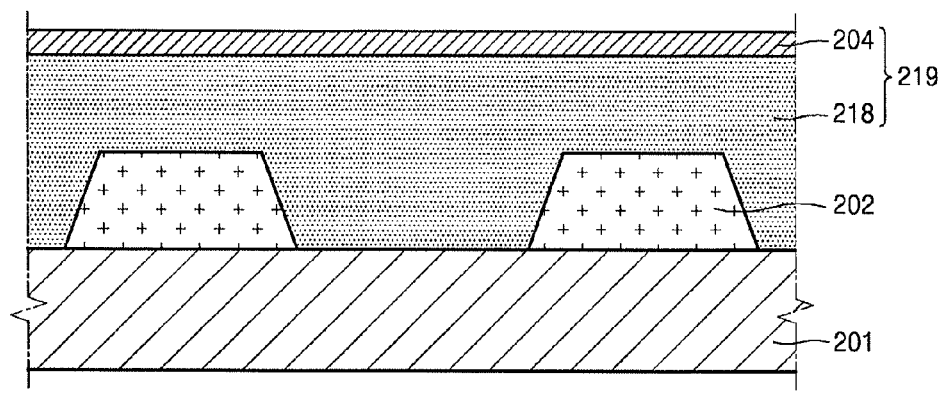
FIGS. 2A through 2G sequentially illustrate a method of forming a thin film on a display substrate, according to an exemplary embodiment.

FIGS. 2A through 2G sequentially illustrate a method of forming a thin film on a display substrate 201, according to an exemplary embodiment. At least one TFT and a first electrode of the OLED may be formed on the display substrate 201, and illustrations and descriptions thereof will be omitted. Referring to FIG. 2A, pixel-defining layers 202 which define sub-pixels may be formed on the display substrate 201. A photo-pattern layer 219 may be formed on the pixel-defining layers 202.

Resin 218 which may completely cover the pixel-defining layers 202 may be formed on the display substrate 201. A photoresist 204 may be formed on the resin 218. The resin 218 and the photoresist 204 may be formed by spin coating, etc.

Figure 2B:
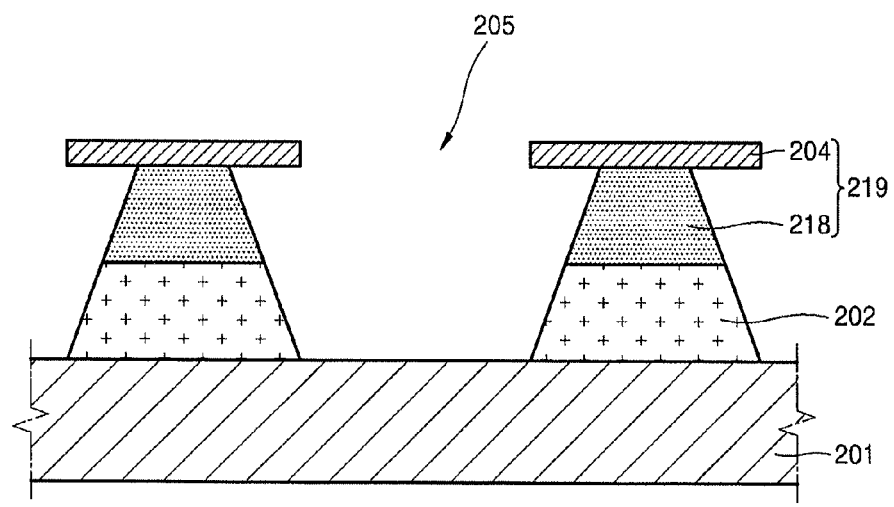

As shown in FIG. 2B, the photo-pattern layer 219 may be patterned by exposing the photoresist 204 to light and developing the same and by etching the resin 218. An opening 205 which exposes at least a portion of the first electrode 113 (refer to FIG. 1) may be formed between the pixel-defining layers 202 which are adjacent to each other. The opening 205 may correspond to the emission area of each sub-pixel.

Figure 2C:
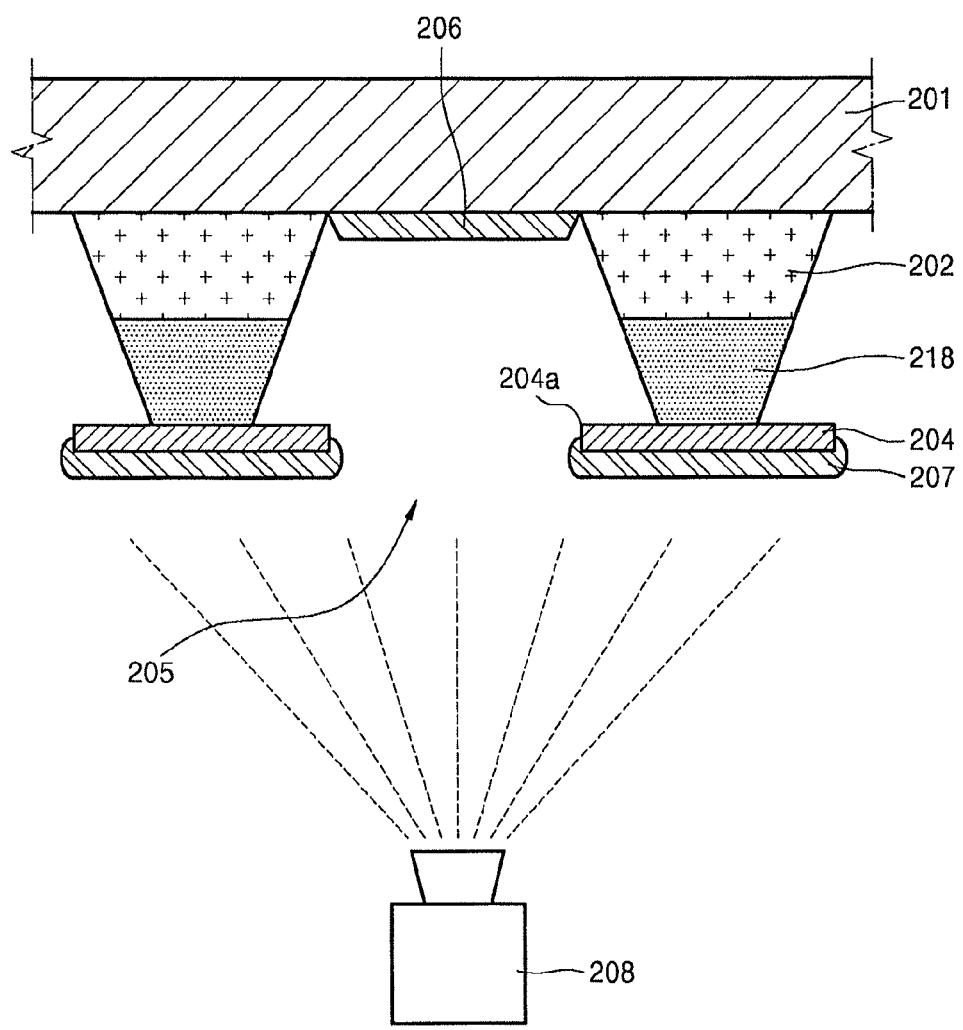

As shown in FIG. 2C, a first pattern layer 206 may be formed on the display substrate 201.

To this end, the display substrate 201 may be arranged on an upper portion of a chamber and a deposition source 208 may be arranged on a lower portion of the chamber. Then, a predetermined amount of heat is provided to the deposition source 208, and deposition materials may be applied by vapor deposition to the display substrate 201 from the deposition source 208. The first pattern layer 206, the emissive layer 209, and a second pattern layer 211 to be described later may be formed by continuous deposition.

The first pattern layer 206 may be formed on the first electrode 113 (refer to FIG. 1). The first pattern layer 206 may include an HIL and an HTL. The first pattern layer 206 may be deposited on the display substrate 201 through the opening 205.

A cross-section of the first pattern layer 206 may gradually decrease in size in a direction away from the display substrate 201, for example, due to an undercut in a lower portion 204a of the photoresist 204.

While the first pattern layer 206 is formed, a first deposition layer 207 may be formed on the photoresist 204 by using the same materials as in the first pattern layer 206.

Figure 2D:
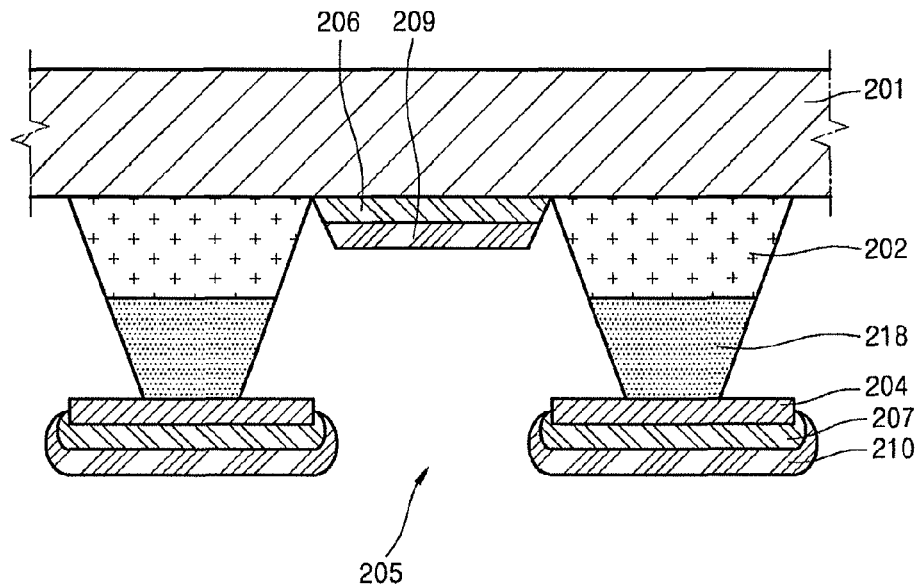

As shown in FIG. 2D, the emissive layer 209 may be formed on the display substrate 201. The emissive layer 209 may include materials emitting red, green, and blue light and may form a deposition material corresponding to one of red, green, and blue colors.

The emissive layer 209 may be formed on the first pattern layer 206. While the emissive layer 209 is formed, a second deposition layer 210 may be formed on the first deposition layer 207 by using the same materials as in the emissive layer 209.

Since the first deposition layer 207 may be deposited on the photoresist 204 and the second deposition layer 210 may be deposited on the first deposition layer 207, thicknesses of layers, for example, thicknesses of the photoresist 204, the first deposition layer 207, and the second deposition layer 210, may gradually increase.

In proportion to the increase of the thicknesses of the layers 204, 207 and 210, the opening 205 via which the deposition materials pass may be gradually covered. An entrance of the opening 205 may become smaller than an entrance of an initial opening 205, and an amount of the deposition materials passing the opening 205 may be decreased, and a cross-section, e.g., cross-sectional width, of the emissive layer 209 may be smaller than that of the first pattern layer 206 in the direction perpendicular to the display substrate 201.

Figure 2E:
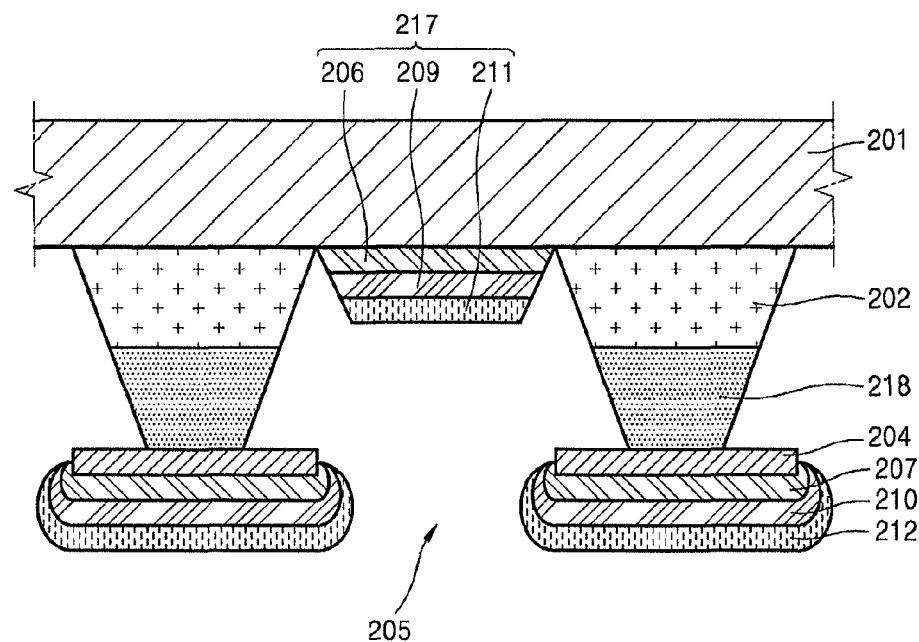

As shown in FIG. 2E, the second pattern layer 211 may be formed on the display substrate 201. The second pattern layer 211 may include an ETL and an EIL.

The second pattern layer 211 may be formed on the emissive layer 209. A cross-section e.g., cross-sectional width, of the second pattern layer 211 may be smaller than that of the emissive layer 209 in the direction perpendicular to the display substrate 201. While the second pattern layer 211 is formed, a third deposition layer 212 may be formed on the second deposition layer 210 by using the same material as in the second pattern layer 211.

An intermediate layer 217 including the first pattern layer 206, the emissive layer 209, and the second pattern layer 211 may be formed on the emission area of a sub-pixel defined by the pixel-defining layers 202, and a cross-section of the intermediate layer 217 may gradually decrease in size in the direction perpendicular to the display substrate 201.

A profile angle of the intermediate layer 217 may be acute.

The profile angle may be arbitrarily adjusted by adjusting a deposition incidence angle while the deposition materials are vaporized by using the deposition source 208 (refer to FIG. 2C) or changing thicknesses of the resin 218 and the photoresist 204 coated on the display substrate 201. For example, the deposition incidence angle of the deposition materials may be increased or the thicknesses of the resin 218 and the photoresist 204 may be decreased to increase the profile angle.

Figure 2F:
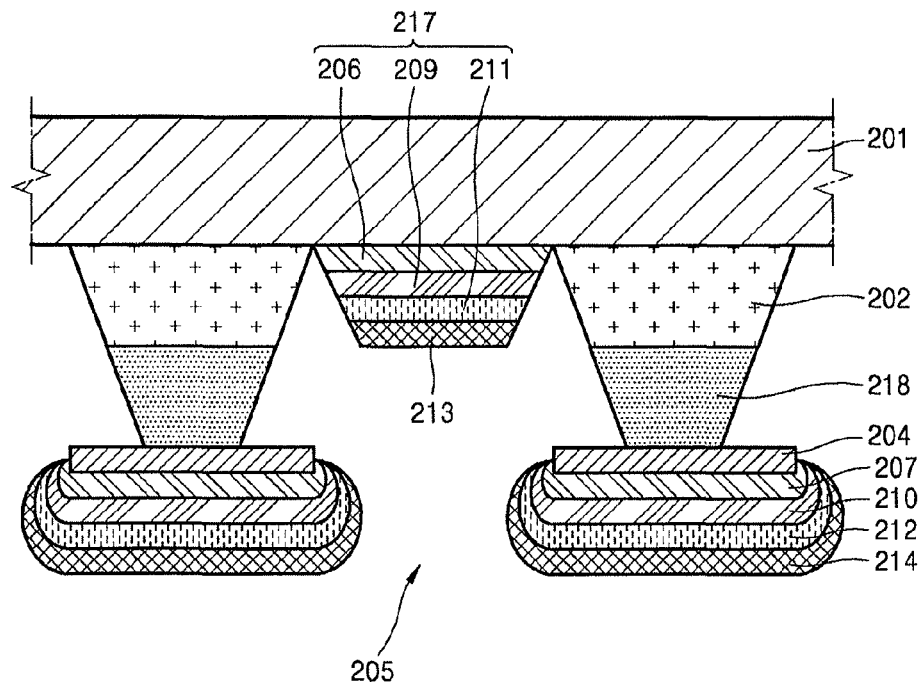

As shown in FIG. 2F, a second electrode 213 may be formed on the display substrate 201. The second electrode 213 may be formed by deposition.

The second electrode 213 may be formed on the second pattern layer 211. While the second electrode 213 is formed, a fourth deposition layer 214 may be formed on the third deposition layer 212 by using the same material as in the second electrode 213. A cross-section e.g., cross-sectional width, of the second electrode 213 may be smaller than that of the second pattern layer 211 in the direction perpendicular to the display substrate 201.

Then, the resin 218, the photoresist 204, the first deposition layer 207, the second deposition layer 210, the third deposition layer 212, and the fourth deposition layer 214 respectively formed on the pixel-defining layers 202 may be removed. For example, a lift-off process in which the resin 218 is separated from the pixel-defining layers 202 may be performed to remove the resin 218, the photoresist 204, the first deposition layer 207, the second deposition layer 210, the third deposition layer 212, and the fourth deposition layer 214 by injecting a solution reacting to the resin 218.

The intermediate layer 217 and the second electrode 213 may be formed only on the emission area of the sub-pixel defined by the pixel-defining layers 202.

In the present exemplary embodiment, the second electrode 213 may be formed on the emission area of the sub-pixel through the opening 205 and may function as a common electrode which applies a common voltage to every sub-pixel.

Figure 2G:
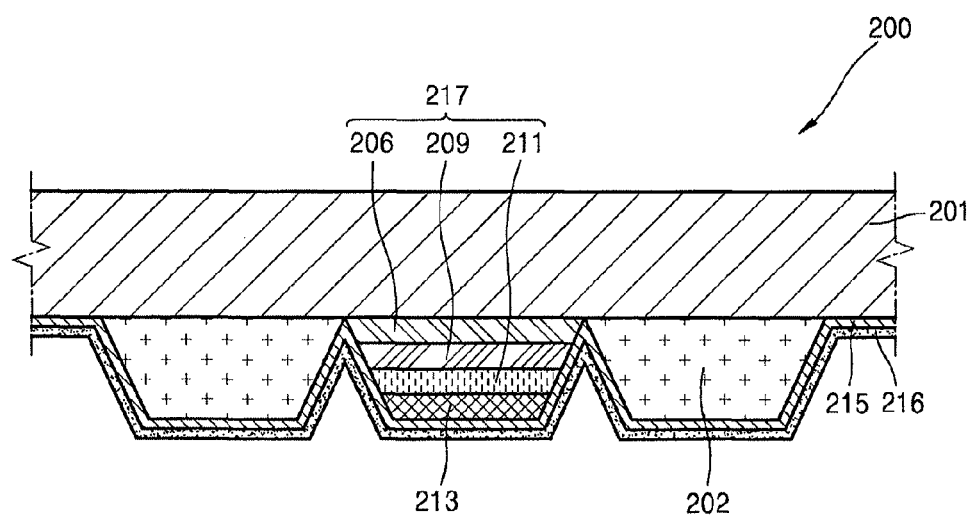

As shown in FIG. 2G, an auxiliary electrode 215 which may be electrically connected to the second electrode 213 may be formed on the display substrate 201. The auxiliary electrode 215 may be formed on the emission area of each sub-pixel and the pixel-defining layers 202. In the present exemplary embodiment, the auxiliary electrode 215 may be formed on outer surfaces of the pixel-defining layers 202, an outer surface of the second electrode 213, and side surfaces of the intermediate layer 217.

The second electrode 213 formed on the emission area of each sub-pixel and the auxiliary electrode 215 formed on an entire area of the display substrate 201 may be electrically connected to each other and may be used as common electrodes which apply the common voltage to every sub-pixel.

Without the auxiliary electrode 215, the second electrode 213 may be formed on the emission area of each sub-pixel and the outer surfaces of the pixel-defining layers 202, instead of being formed only on the emission area of each sub-pixel.

A capping layer 216 may be further formed on the auxiliary electrode 215, and may protect the OLED.

Figure 3A:
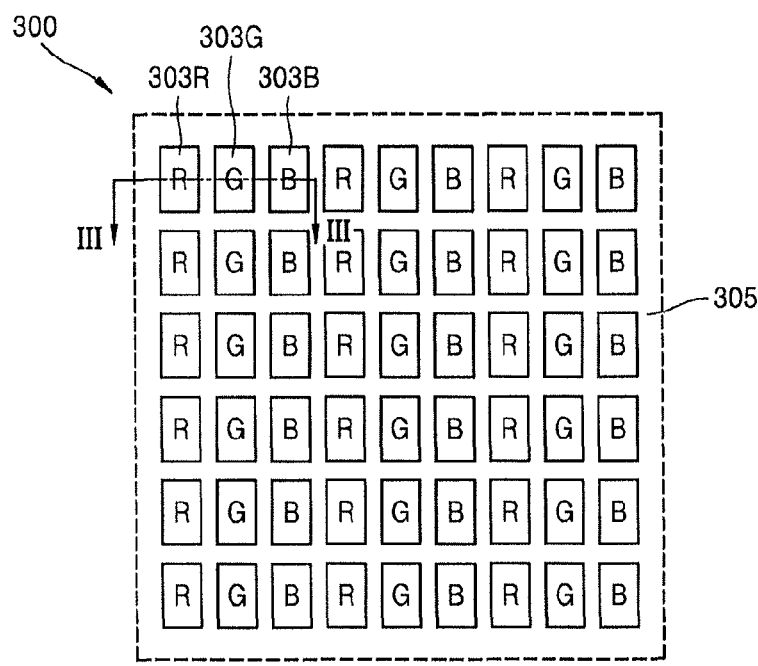
FIG. 3A illustrates a plan view of an organic light-emitting diode (OLED) of an organic light-emitting display apparatus, according to an exemplary embodiment.
Figure 3B:
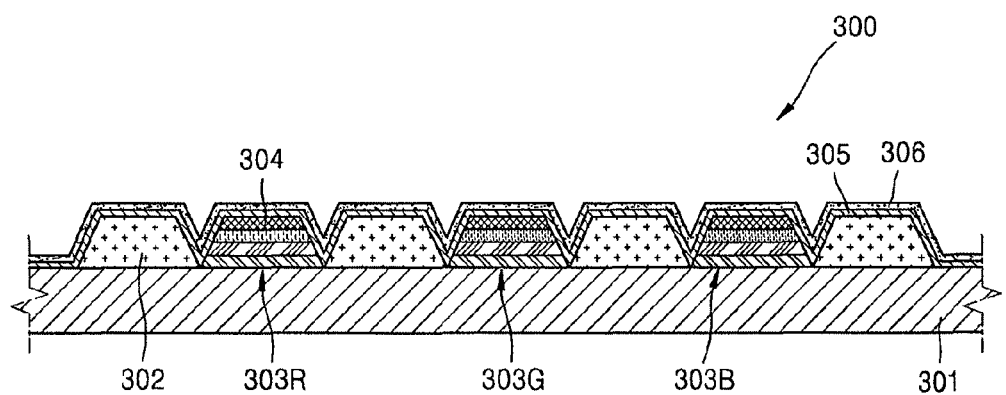
FIG. 3B illustrates a cross-sectional view taken along a line of FIG. 3A.

FIG. 3A illustrates a plan view of an OLED of an organic light-emitting display apparatus 300, according to an exemplary embodiment, and FIG. 3B illustrates a cross-sectional view taken along a line of FIG. 3A. Referring to FIGS. 3A and 3B, a red intermediate layer 303R, a green intermediate layer 303G, and a blue intermediate layer 303B may be arranged on a display substrate 301. The red intermediate layer 303R, the green intermediate layer 303G, and the blue intermediate layer 303B may be formed on an emission area of each sub-pixel defined by a pixel-defining layer 302. The red intermediate layer 303R, the green intermediate layer 303G, and the blue intermediate layer 303B may have a dot pattern.

A second electrode 304 may be formed on the red intermediate layer 303R, the green intermediate layer 303G, and the blue intermediate layer 303B. The second electrode 304 may be formed on the emission area of each sub-pixel.

An auxiliary electrode 305 may be formed on the second electrode 304. The auxiliary electrode 305 may be formed on an outer surface of the pixel-defining layer 302, an outer surface of the second electrode 304, and side surfaces of the red intermediate layer 303R, the green intermediate layer 303G, and the blue intermediate layer 303B. The second electrode 304 and the auxiliary electrode 305 may be electrically connected to each other.

Figure 4:
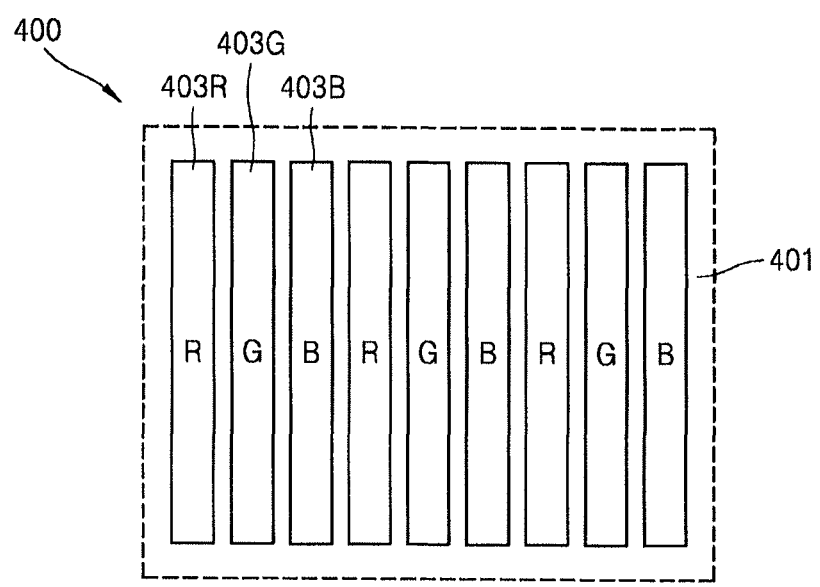
FIG. 4 illustrates a plan view of an OLED of an organic light-emitting display apparatus, according to another exemplary embodiment.

FIG. 4 illustrates a plan view of an OLED of an organic light-emitting display apparatus 400, according to another exemplary embodiment. Referring to FIG. 4, a red intermediate layer 403R, a green intermediate layer 403G, and a blue intermediate layer 403B may be arranged on a display substrate 401. The red intermediate layer 403R, the green intermediate layer 403G, and the blue intermediate layer 403B may be formed on an emission area of each sub-pixel.

The red intermediate layer 403R, the green intermediate layer 403G, and the blue intermediate layer 403B may have a stripe pattern. The red intermediate layer 403R, the green intermediate layer 403G, and the blue intermediate layer 403B have the same cross-section pattern as the red intermediate layer 303R, the green intermediate layer 303G, and the blue intermediate layer 303B of FIG. 3, and descriptions thereof will be omitted.

By way of summation and review, an organic light-emitting display apparatus may have an emissive layer disposed between an anode and a cathode. The anode, the cathode, and the emissive layer may be formed by photolithography or deposition.

As described above, according to the one or more of the above exemplary embodiments of the organic light-emitting display apparatus and the method of manufacturing the same, pattern profiles of, for example, the common electrode or the capping layer, may be gradually formed on the intermediate layer. Short circuiting of wires may be prevented, and a high-resolution and large-sized organic light-emitting display apparatus may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus comprising:
   a display substrate;
   an organic light-emitting diode (OLED) including a first electrode, an intermediate layer on the first electrode, and a second electrode on the intermediate layer; and
   a pixel-defining layer including an opening that exposes at least a portion of the first electrode,
   wherein the intermediate layer includes a plurality of layers, and
   areas of upper surfaces of the plurality of layers decrease in a direction perpendicular to the display substrate, the direction being a direction away from the display substrate.

2. The organic light-emitting display apparatus of claim 1, wherein an area of an upper surface of a bottom layer of the intermediate layer is the greatest, the bottom layer being the closest to the display substrate, and
   an area of an upper surface of a top layer of the intermediate layer is the smallest, the top layer being the farthest from the display substrate.

3. The organic light-emitting display apparatus of claim 2, wherein the plurality of layers of the intermediate layer continue to be stacked in the direction away from the display substrate.

4. The organic light-emitting display apparatus of claim 2, wherein, when viewed from a top view, the upper surface of the top layer of the intermediate layer is within the upper surface of the bottom layer of the intermediate layer.

5. The organic light-emitting display apparatus of claim 1, wherein the intermediate layer includes:
   an emissive layer; and
   at least one pattern layer stacked on at least one surface of the emissive layer.

6. The organic light-emitting display apparatus of claim 5, wherein the at least one pattern layer includes at least one of a hole injection layer (HIL), a hole transport layer (HTL), an electron transport layer (ETL), or an electron injection layer (EIL).

7. The organic light-emitting display apparatus of claim 6, wherein a first pattern layer including the HIL and the HTL is between the first electrode and the emissive layer,
   a second pattern layer including the ETL and the EIL is between the emissive layer and the second electrode, and
   an area of an upper surface of the first pattern layer is greater than an area of an upper surface of the second pattern layer.

8. The organic light-emitting display apparatus of claim 5, wherein the intermediate layer is in an emission area of each of sub-pixels defined by the pixel-defining layer.

9. The organic light-emitting display apparatus of claim 5, wherein the second electrode is in the emission area of each sub-pixel,
   an auxiliary electrode is on the second electrode and is electrically connected to the second electrode in order to apply a common voltage to each sub-pixel, and
   the auxiliary electrode extends over the emission area of each sub-pixel and the pixel-defining layer.

10. The organic light-emitting display apparatus of claim 5, wherein the second electrode extends over the emission area of each sub-pixel and the pixel-defining layer.

11. The organic light-emitting display apparatus of claim 1, wherein a cross-sectional width of the intermediate layer decreases in the direction perpendicular to the display substrate.

12. The organic light-emitting display apparatus of claim 11, wherein the intermediate layer is positive-taper shaped.

13. The organic light-emitting display apparatus of claim 12, wherein an angle of a taper of the intermediate layer is an acute angle.

14. The organic light-emitting display apparatus of claim 11, wherein each of the plurality of layers of the intermediate layer has a cross-sectional width decreasing in the direction away from the display substrate.

15. The organic light-emitting display apparatus of claim 11, wherein a cross-sectional area of at least one layer of the plurality of layers is smaller than a cross-sectional area of at least another layer of the plurality of layers, and
   the at least one layer is above the at least another layer in the direction away from the display substrate.

* * * * *